(12) United States Patent
Ishida et al.

(10) Patent No.: US 6,620,245 B2
(45) Date of Patent: Sep. 16, 2003

(54) LIQUID COATING APPARATUS WITH TEMPERATURE CONTROLLING MANIFOLD

(75) Inventors: Seiki Ishida, Kumamoto-Ken (JP); Junichi Iwano, Kumamoto-Ken (JP); Jun Ookura, Kumamoto-Ken (JP); Michishige Saito, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 122 days.

(21) Appl. No.: 09/893,707

(22) Filed: Jun. 29, 2001

(65) Prior Publication Data

US 2002/0011208 A1 Jan. 31, 2002

(30) Foreign Application Priority Data

Jul. 3, 2000 (JP) ........................................ 2000-200974

(51) Int. Cl.[7] .............................................. B05C 11/00
(52) U.S. Cl. ...................................... 118/667; 118/666
(58) Field of Search ................................ 118/666, 667, 118/52, 56, 712, 713; 427/8, 9, 10

(56) References Cited

U.S. PATENT DOCUMENTS

| | | | |
|---|---|---|---|
| 5,002,008 A | 3/1991 | Ushijima et al. | |
| 5,849,084 A | * 12/1998 | Hayes et al. | 118/320 |
| 5,960,225 A | * 9/1999 | Fujimoto | 396/611 |
| 6,258,167 B1 | * 7/2001 | Kawano et al. | 118/667 |
| 6,376,013 B1 | * 4/2002 | Rangarajan et al. | 427/240 |

* cited by examiner

Primary Examiner—Richard Crispino
Assistant Examiner—George R. Koch, III
(74) Attorney, Agent, or Firm—Rader, Fishman & Grauer PLLC (57) ABSTRACT

An apparatus for processing a substrate of the present invention comprises a holder holding a substrate, a supply pipe being supplied with a processing solution from a first end and supplying the processing solution to the substrate from a second end, a first temperature controller having a first temperature controlled water circulated inside which controls a first temperature around the second end of the supply pipe and a second temperature controller having a second temperature controlled water drained from the first temperature controller circulated inside, which controls a second temperature around the first end of the supply pipe. With such a configuration, the temperature controlled water used for controlling the temperature of the processing solution just before its application onto the substrate can be recycled for controlling the temperature of the processing solution just after being supplied to a supply pipe.

14 Claims, 8 Drawing Sheets

LIQUID COATING APPARATUS WITH TEMPERATURE CONTROLLING MANIFOLD

BACKGROUND OF THE INVENTION

1. Field of the Invention

The present invention relates to a coating apparatus which applies solutions such as a resist solution and a developing solution onto substrates such as a semi-conductor wafer and the like.

2. Description of the Related Art

In a photolithography step in a process of semiconductor device fabrication, for example, a resist solution coating process for forming a resist film onto a front face of a semiconductor wafer (hereinafter, referred to as a "wafer") is performed and a developing process is performed against a wafer coated with a resist film after the exposure.

When looking at a resist solution coating process, methods like a spin coating method is used often as a method for applying resist solution onto a front face of a wafer uniformly.

Application of the resist solution by the spin coating method is performed by spinning a wafer while being vacuum sucked on a spin chuck, and supplying the resist solution by dripping it from a nozzle onto the front face of a wafer right above the rotation center. The resist solution is being spread from the center of the wafer to the whole surface by centrifugal force.

In this kind of a resist coating apparatus, a quality of a resist film is being considered and the resist solution controlled in a predetermined temperature is supplied onto a wafer. Such temperature control of the resist solution is performed, for example, by a temperature controlling pipe provided around the tip of the nozzle for discharging the resist solution, where the temperature controlling pipe is disposed in such a manner to surround the resist solution pipe that resist solution flows therein. Temperature control of the resist solution is performed indirectly by having temperature of, for example, pure water flowing through the temperature controlling pipe controlled. After the pure water in the temperature controlling pipe is used for temperature control, the pure water flows back to a temperature controlling portion, where its temperature is readjusted, and is supplied to the temperature controlling pipe again.

In a resist coating apparatus like this, however, it is necessary to set a temperature of the pure water flowing in the temperature controlling pipe high when there is a considerable difference between the temperature of the resist solution before being controlled and the predetermined temperature thereof in time of application of the resist solution, which requires great energy.

SUMMARY OF THE INVENTION

An object of the present invention is to provide a substrate processing apparatus which efficiently supply processing solutions such as a resist solution and the like to be applied to a substrate to be processed in a predetermined temperature.

In order to achieve the above objectives, a substrate processing apparatus of the present invention comprises a holder holding the substrate, a plurality of nozzles which supply a processing solution on to the held substrate, a manifold having a plurality of pipes running inside and controls a temperature of the processing solution flowing inside the pipes and supplied to the nozzles with a temperature controlled water, and a temperature controlled water supplier which supplies the temperature controlled water to the manifold. A resist coating and developing processing system relating to another aspect of the present invention comprises a resist solution supply unit having a holder which holds the substrate and a plurality of nozzles supplying a resist solution to the held substrate, a developing processing unit performing a developing process to the substrate after the exposure, a heat processing unit performing a heat process to the substrate, a transfer mechanism transferring the substrate at least between the said units, a manifold controlling a temperature of the processing solution supplied to the nozzles with a temperature controlled water and a temperature controlled water supplier which supplies the temperature controlled water to the manifold.

In the present invention, since a temperature of a processing solution supplied to all of the nozzles through a manifold is controlled with a temperature controlled water, the manifold and a temperature controlled water supplier supplying temperature controlled water controlled to the manifold can be made compact, for example, they can be built inside the resist coating and developing processing system. In this manner, processing solutions such as a resist solution and the like that are being applied to a substrate to be processed can be efficiently supplied in a predetermined temperature since the manifold and the temperature controlling water supplier is in the same temperature condition as that of inside the system.

A substrate processing apparatus relating to yet another aspect of the present invention comprises a holder holding a substrate, a supply pipe being supplied with a processing solution from a first end and supplying the processing solution to the substrate from a second end, a first temperature controller having a first temperature controlled water circulated inside which controls a first temperature around the second end of the supply pipe and a second temperature controller having a second temperature controlled water drained from the first temperature controller circulated inside, which controls a second temperature around the first end of the supply pipe.

With such a configuration of the present invention, temperature of the processing solution can be controlled efficiently by recycling the temperature controlled water used for controlling the temperature of the processing solution just before its application onto the substrate, for controlling the temperature of the processing solution just after being supplied to a supply pipe.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, embodiments of the present invention will be explained with reference to the drawings.

Figure 1:
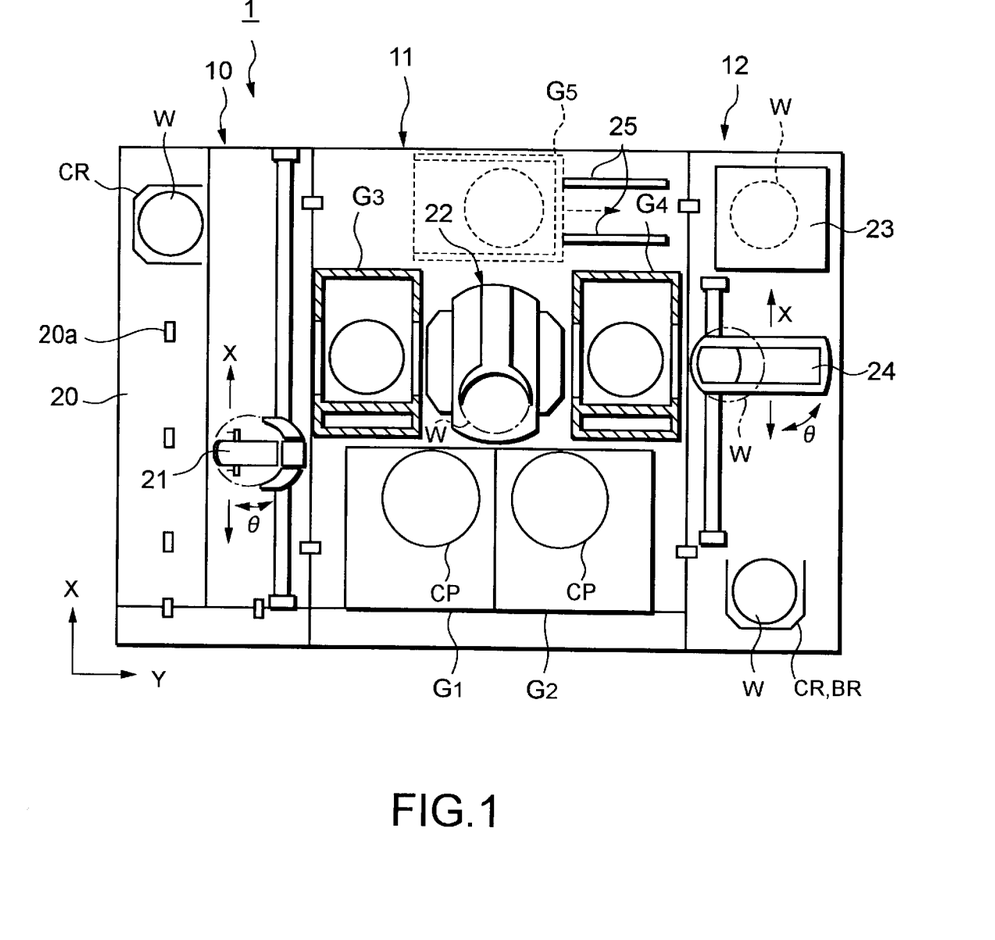
FIG. 1 is a plan view showing the whole construction of a coating and developing processing system for a semiconductor wafer as an embodiment of the present invention.
Figure 2:
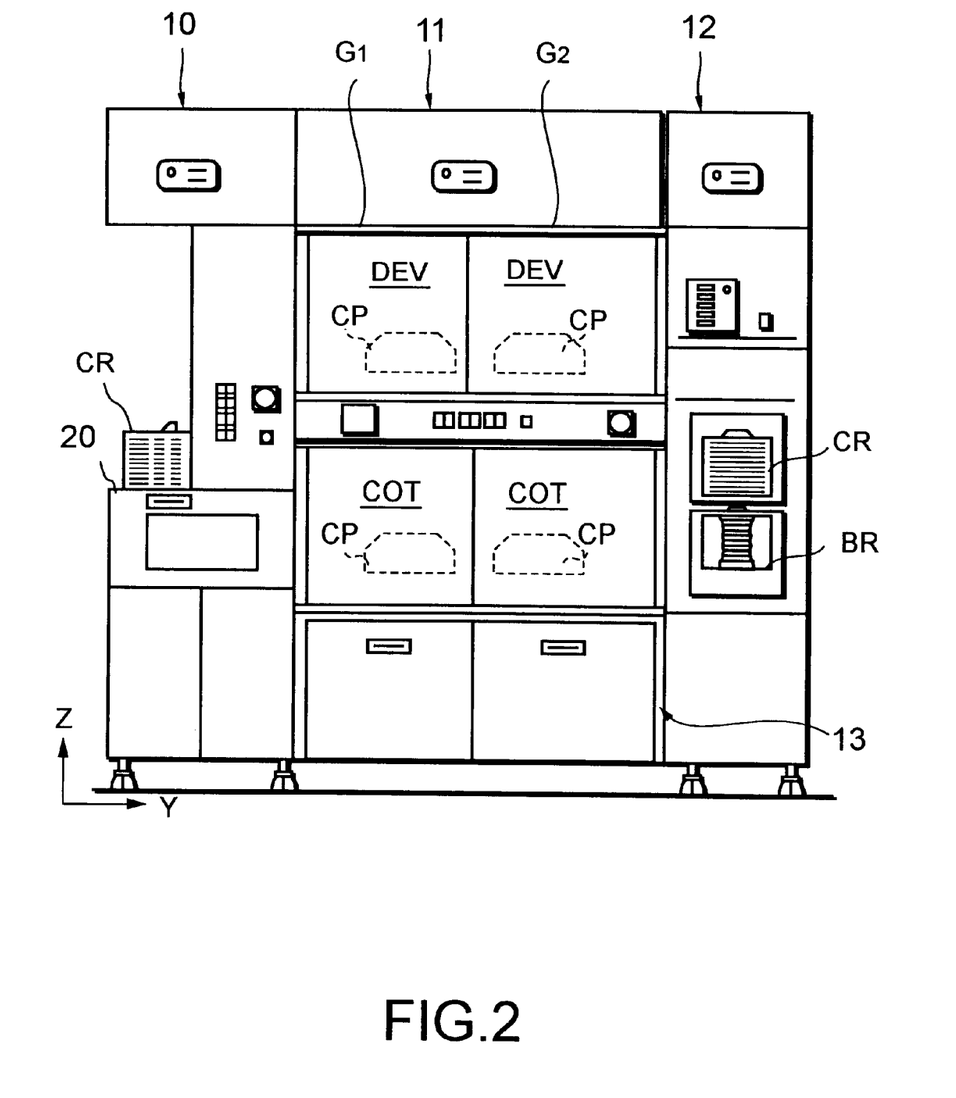
FIG. 2 is a front view showing a construction of the coating and developing processing system shown in FIG. 1.
Figure 3:
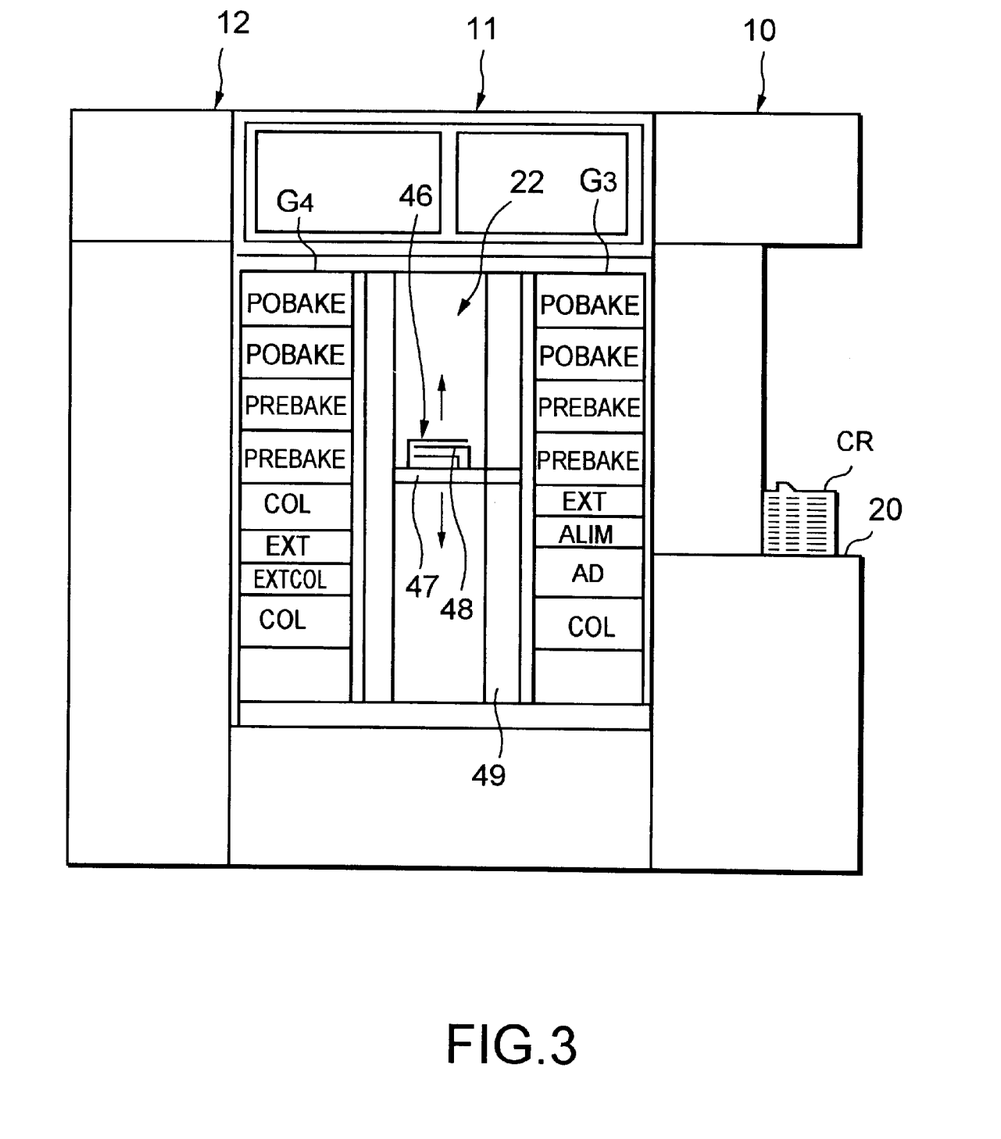
FIG. 3 is a rear view showing a construction of the coating and developing processing system shown in FIG. 1.

FIG. 1 to FIG. 3 are views showing an entire construction of a coating and developing processing system 1 of a semi-conductor wafers (hereinafter called the wafers) in which a resist coating apparatus is being adopted as a substrate processing apparatus according to an embodiment of the present invention. FIG. 1 is a plan view, FIG. 2 is a front view, and FIG. 3 is a rear view.

A coating and developing system 1 is comprised of a cassette station 10 for carrying a plurality of, for example, 25 semiconductor wafers per a wafer cassette CR, as a unit, into or out of the system from or to an outside, and carrying the wafer W in and out of the wafer cassette CR, a processing station 11 constituted by stacking various kinds of processing stations each for performing predetermined processing for the wafers W one by one in the resist coating process at predetermined locations in multiple tiers, and a interface section 12 for transferring wafer W are integrally connected.

In the cassette station 10, as shown in FIG. 1, a plurality of, for example, up to four cassettes CR are placed in a line in an X-direction with respective outlet and inlet ports for the wafer W facing the processing station 11 side at positions of projections 20a on a cassette mounting table 20. A wafer transfer mechanism 21 movable in the direction of arrangement of the cassettes (an X-direction) and in the direction of arrangement of the wafers housed in the wafer cassette CR (a Z-vertical direction) is structured to be selectively accessible to each of the wafer cassettes CR.

Further, the wafer transfer mechanism 21 is structured to be rotatable in a ⊖-direction so as to be accessible to an alignment unit (ALIM) and extension unit (EXT) included in a multistage station section of a third unit group G3 at the processing station 11 side as will be described later.

In the aforementioned processing station 11, as shown in FIG. 1, a vertical carrier type of a main wafer transfer mechanism 22 with a wafer transfer device is provided, around which a pair of or a plurality of pairs of all processing stations are multi-tiered.

As shown in FIG. 3, the main wafer transfer mechanism 22 includes a wafer transfer device 46 which is ascendable and descendable in the vertical direction (the Z-direction) inside a cylindrical supporter 49. The cylindrical supporter 49 is connected to a rotating shaft of a motor (not shown) and rotates integrally with the wafer transfer device 46 around the aforesaid rotating shaft by rotational driving force of the motor. Accordingly, the wafer transfer device 46 is rotatable in the θ-direction. Furthermore, cylindrical supporter 49 may be constructed so that it is connected to another rotating shaft (not shown) rotated by said motor.

The wafer transfer device 46 comprises a plurality of holding member 48 that is movable in cross direction of a transfer base 47, realizing a delivery of wafer W between each processing unit.

In this example, five processing unit groups G1, G2, G3, G4 and G5 can be disposed, multi-tired units of a first and a second processing unit groups G1 and G2 are disposed on the front side of the system, (the front in FIG. 1) a multi-tired units of the third processing unit group G3 is disposed adjacent to the cassette station 10, a multi-tired unit of a fourth processing unit group G4 is disposed adjacent to the interface section 12, and a multi-tired unit of a fifth processing unit group G5 is disposed on the rear side.

In the first processing unit group G1, as shown in FIG. 2, two spinner-type processing units for performing predetermined processing while the wafer W is mounted on a spin chuck within a cup CP, for example, a resist coating unit (COT) and a developing processing unit (DEV) are two-tiered from the bottom in order. Similarly, in the second processing unit group G2, two spinner-type processing units, for example, a resist coating unit (COT) and a developing processing unit (DEV) are two-tiered from the bottom in order. It is preferable for these resist coating units (COT) to be disposed in the lower tire because drainage of a resist solution is troublesome from a point of view of both maintenance and its structure. However, it is of course possible to dispose the resist coating unit in upper tire when necessary. Furthermore, chemical area 13 in which a processing solution such as a resist solution and the like is provided in the lower part of the resist coating unit (COT).

In the third processing unit group G3, as shown in FIG. 3, an oven type processing unit which performs predetermined processes on the wafer W by mounting it on the mounting table SP, for example a cooling processing unit (COL) for performing the cooling process, an adhesion processing unit (AD) for performing so called hydrophobic process to enhance the adhesion of a resist, an alignment unit (ALIM) for aligning the wafer W, an extension unit (EXT), prebaking units (PREBAKE) for performing heat processing before the exposure, post-baking units (POBAKE) for performing heat processing after the exposure, are, for example, eight-tiered from the bottom in order. In the fourth processing unit group G4, an oven type processing unit, for example, a cooling unit (COL), an extension and cooling unit (EXTCOL), an extension unit (EXT), pre-baking units (PREBAKE), post-baking units (POBAKE), or the like are, for example, eight-tiered from the bottom in order.

The heat influence between each unit can be reduced by disposing cooling unit (COL) and the extension cooling unit (EXTCOL) which performs processes in low temperature in lower tire, and disposing baking unit (PREBAKE), post-baking unit (POBAKE) and adhesion unit (AD) which performs processes in high temperature in upper tire in this manner. Of course, the units may be disposed multi-tired at random.

The interface section 12 has the same dimension as that of the processing station 11 in the depth direction (the X-direction), but is set to a size smaller than that in the width direction. A transportable pickup cassette CR and a fixed-type buffer cassette BR are two-tiered at the front of the interface section 12, whereas, an edge exposure unit 23 is disposed at the rear, and a wafer transfer mechanism 24 is further provided at the center. The wafer transfer mechanism 24 is configured to move in the X-direction and the Z-direction to get access to both the cassettes CR and BR and the edge exposure unit 23. The wafer transfer mechanism 24 is configured to be rotatable also in the ⊖-direction so as to be accessible to the extension unit (EXT) included in the multi-tiered units of the fourth processing unit group G4 on the processing station 11 side and also to a wafer delivery table (not shown) on the adjacent aligner side.

In the coating and developing system 1, the multi-tiered units of the fifth processing unit group G5 shown by a broken line can be disposed, as has been described, on the rear side of the main wafer transfer mechanism 22. The multi-tiered units of the fifth processing unit group G5 are configured to shift along guide rails 25 laterally as viewed from the main wafer transfer mechanism 22. Accordingly, even when the multi-tiered units of the fifth processing unit group G5 are provided as shown in the figure, they are slid along the guide rails 25 to thereby secure a space, so that maintenance operation can be easily performed for the main wafer transfer mechanism 22 from the back side. It should be noted that the space for the maintenance operation for the main wafer transfer mechanism 22 can be easily secured not only by slide-shifting the multi-tiered units of the fifth processing unit group G5 linearly along the guide rails 25 as described above, but also by rotationally shifting them toward the outside of the system as shown by a reciprocating rotational arrow of a one-dotted chain line in FIG. 1.

Figure 4:
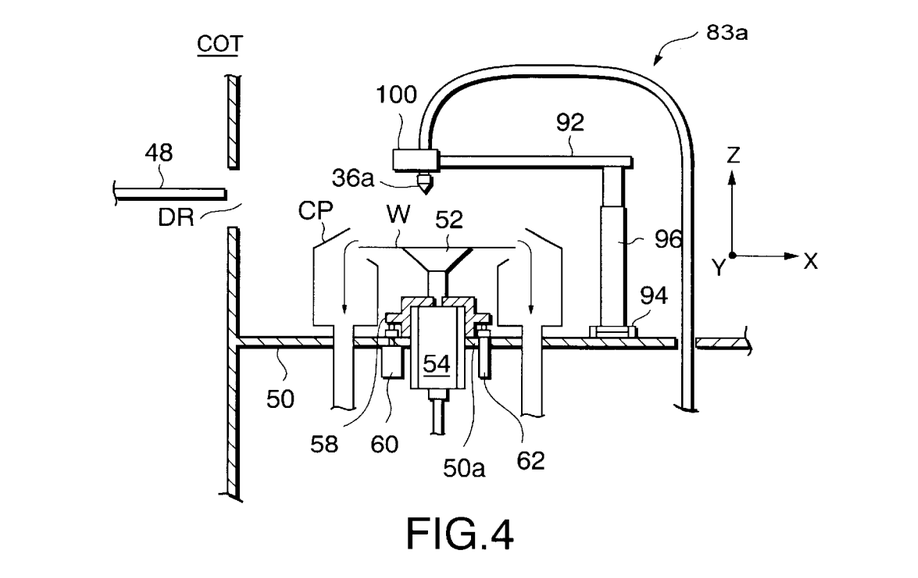
FIG. 4 is a schematic cross-sectional view of a resist coating unit in the coating and developing processing system shown in FIG. 1.
Figure 5:
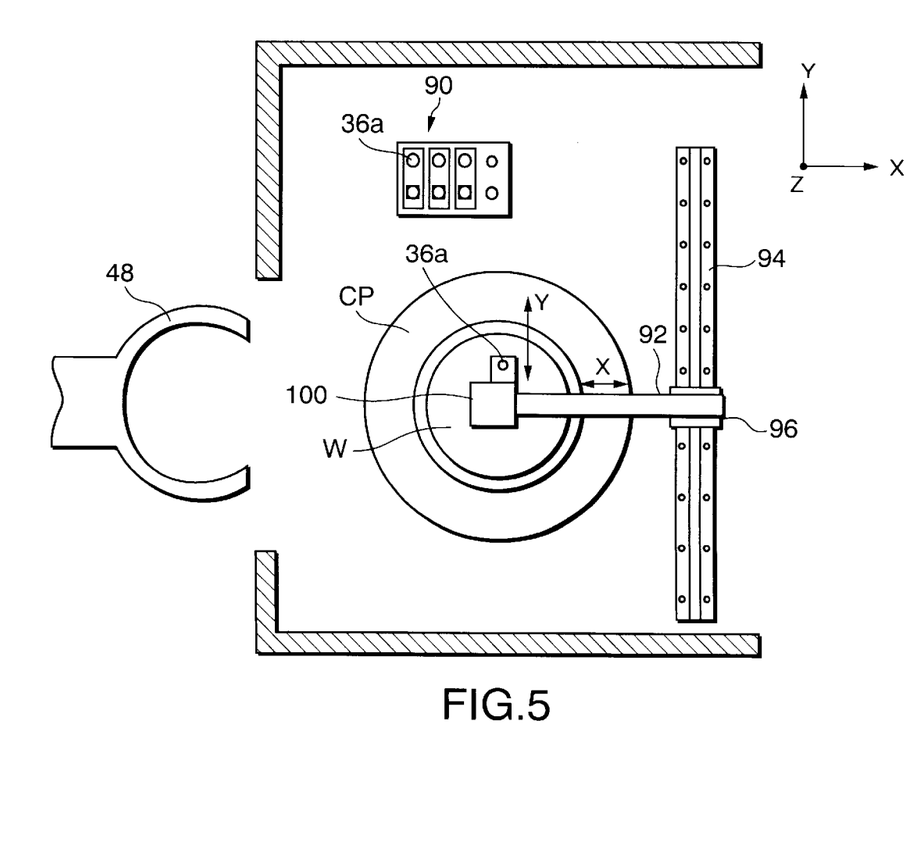
FIG. 5 is a plan view of the resist coating unit shown in FIG. 4.
Figure 6:
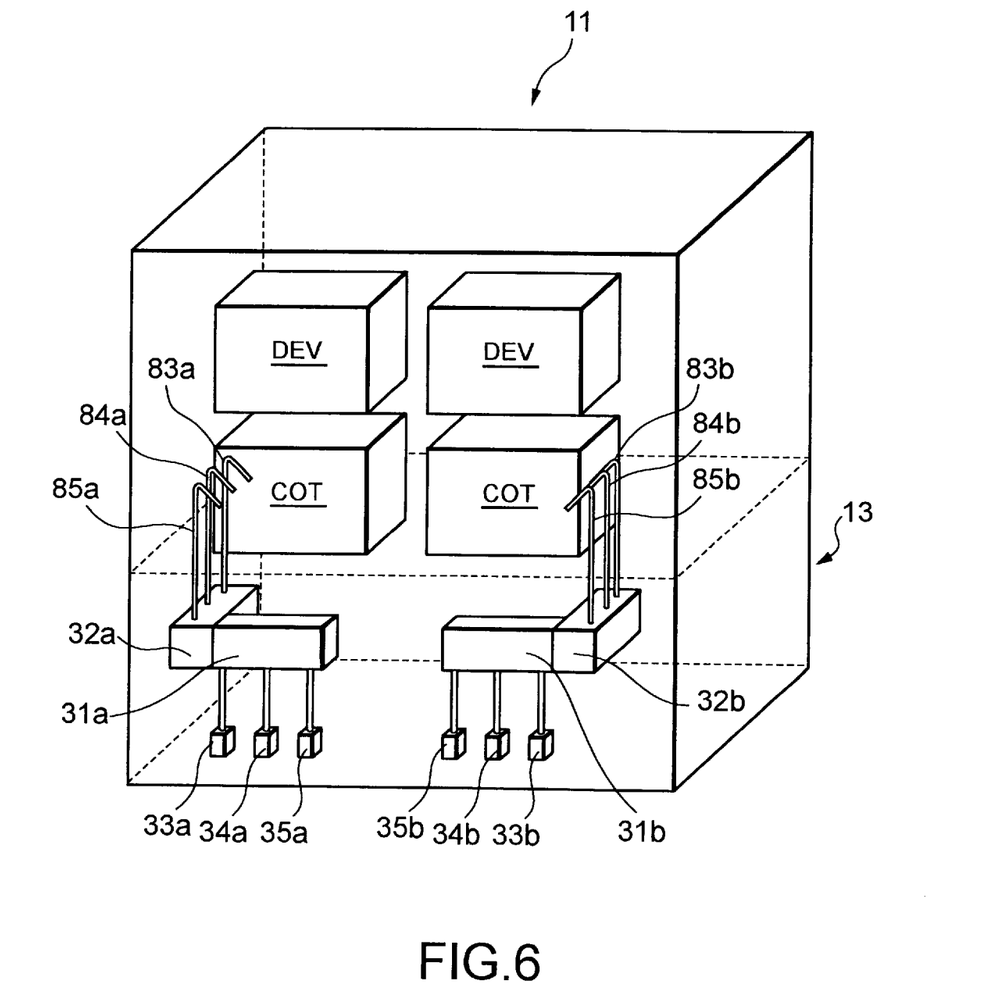
FIG. 6 is a partially schematic perspective view of the resist coating unit shown in FIG. 1
Figure 7:
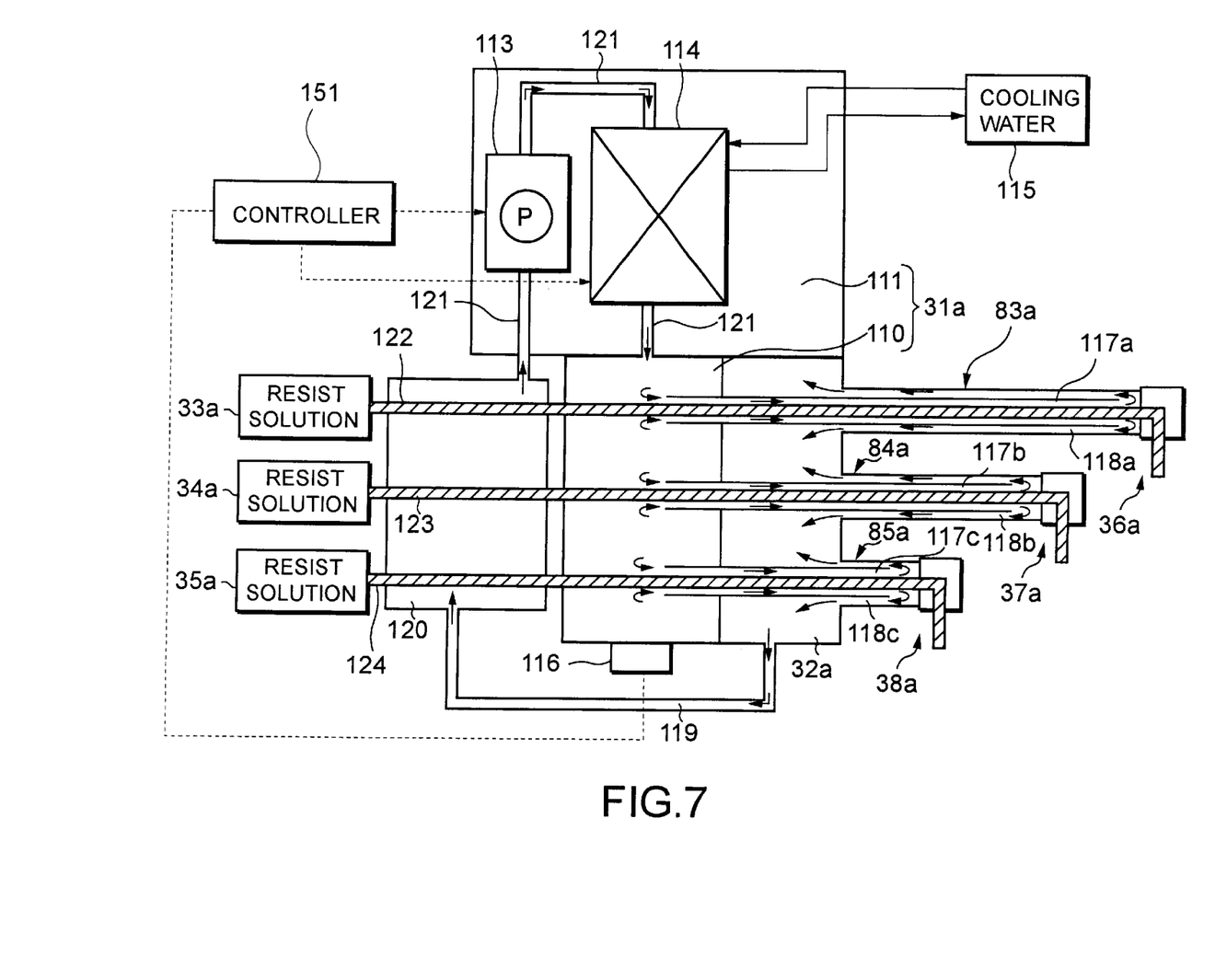
FIG. 7 is a diagram for explaining the structure of a resist solution supply system in the chemical area.

Next, the structures of the resist coating unit (COT) and the chemical area 13 according to this embodiment are explained using FIG. 4 to FIG. 7. FIG. 4 is a schematic cross-sectional view showing the structure of the resist coating unit (COT), and FIG. 5 is a plan view thereof. The explanation is made taking one of the two resist coating units (COT) as an example here, however, the other resist coating unit (COT) has the same structure. FIG. 6 is a partially schematic perspective view of the processing station. FIG. 7 is a diagram for explaining the structure of a resist solution supply system in the chemical area 13.

As shown in FIG. 4 and FIG. 5, an annular cup CP is disposed at the center of the resist coating unit (COT), and a spin chuck 52 is disposed inside the cup CP. The spin chuck 52 is rotated by a driving motor 54 while securely holding the semiconductor wafer W by vacuum-suction. The driving motor 54 is disposed in an opening 50a which is provided in a unit bottom plate 50 to be ascendable and descendable, and is joined with a raising and lowering mechanism 60 and a raising and lowering guide mechanism 62 which are composed of, for example, air cylinders via a cap-shaped flange member 58 made of, for example, aluminum.

A nozzle 36a for supplying the resist solution to the front face of the semiconductor wafer W is detachably attached to the tip of a nozzle scan arm 92 through a nozzle holder 100. The nozzle scan arm 92 is attached to the upper end of a vertical support member 96 which is horizontally movable on a guide rail 94 which is laid in one direction (the Y-direction) on the unit bottom plate 50 so as to move in the Y-direction integrally with the vertical support member 96 by a Y-direction driving mechanism not shown.

The nozzle scan arm 92 is movable also in the X-direction perpendicular to the Y-direction in order to selectively attach thereto the nozzle 36a out of a plurality of nozzles at a nozzle waiting portion 90, movable also in the X-direction by a X-direction driving mechanism not shown. Further, the plurality of nozzles, three nozzles here, the nozzle 36a and nozzles 37a and 38a described later, are provided and properly used in accordance with kinds or viscosities of the resist solutions.

The nozzles 36a, 37a and 38a are respectively connected, through the tube 83a and tubes 84a and 85a described below, to resist solution tanks 33a to 35a in the chemical area which is disposed in a chamber under the resist coating unit (COT).

Next, the structure in the chemical area is explained using FIG. 6 and FIG. 7. FIG. 7 is a diagram for explaining the supply structure of the resist solution supplied to the resist coating unit (COT) shown on the left-hand side out of the two resist coating units (COT) shown in FIG. 6.

As shown in FIG. 6, in the chemical area 13 in the processing station 11, the tubes 83a to 85a or 83b to 85b each for supplying the resist solution onto the wafer W, manifold 32a or 32b, circulation unit 31a or 31b, and the resist solution tanks 33a to 35a or 33b to 35b each for storing the resist solution as a processing solution, are provided for each resist coating unit (COT). The tubes 83a to 85a are connected to corresponding resist solution tanks 33a to 35a at the ends on one side, and provided with the nozzles 36a to 38a at the tips of the ends on the other side respectively. Similarly, the tubes 83b to 85b are connected to corresponding resist solution tanks 33b to 35b at the ends on one side, and provided with the nozzles 36b to 38b at the tips of the ends on the other side respectively. From the nozzles 36a to 38a (38b to 38b), the resist solutions stored in the resist solution tanks 33a to 35a (33b to 35b) are discharged through the tubes 83a to 85a (83b to 85b). Each of the tubes 83a to 85a or 83b to 85b has a supply pipe through which the resist solution flows and a temperature controlling pipe as a first temperature controller which is provided near the tip of the tube to surround the supply pipe. Inside each temperature controlling pipe, temperature controlled water controlled at a desired temperature flows, so that this temperature controlled water indirectly controls the temperature of the resist solution in the supply pipe. The temperature controlled water is controlled to the desired temperature in the circulation units 31a or 31b, and distributed to the temperature controlling pipes corresponding to a plurality of the tubes 83a to 85a or 83b to 85b in the manifold 32a or the manifold 32b. The temperature controlled water distributed to the temperature controlling pipes and used for the temperature control returns to the circulation unit 31a or 31b, and then it is controlled in temperature again and distributed to the temperature controlling pipes, which operation is repeated. As the temperature controlled water, for example, pure water is used.

As shown in FIG. 7, the tubes 83a to 85a have supply pipes 122 to 124 each for supplying the resist solution, and temperature controlling pipes 117a to 117c as the first temperature controllers provided near the tips of the tubes to surround the supply pipes 122 to 124. Further, drain pipes 118a to 118c, communicating with the temperature controlling pipes 117a to 117c near the tips of the nozzles 36a to 38a, for draining the temperature controlled water used for the temperature control in the temperature controlling pipes 117a to 117c are provided to surround the temperature controlling pipes 117a to 117a. The drain pipes 118a to 118c communicate with the manifold 32a, so that the temperature controlled water passing through the drain pipes 118a to 118c to be drained flows through the manifold 32a into a pipe 119, and is further supplied to a preparatory temperature controller 120 as a second temperature controller. The preparatory temperature controller 120 is disposed on one end side of the supply pipes 122 to 124 to surround the supply pipes 122 to 124. The temperature controlled water supplied to the preparatory temperature controller 120 is at a water temperature close to a desired temperature although it is slightly different in value from the desired temperature because of the elapse of time after the water is controlled in a temperature controlled water controller 111 described 17 below. Therefore, the resist solutions supplied from the resist solution tanks 33a to 35a into the supply pipes pass through the preparatory temperature controller 120, whereby the resist solutions can previously be controlled to a temperature close to the desired temperature. In this embodiment, the temperature control is thus preparatorily conducted using the already-used temperature controlled water before the temperature control by the temperature controlling pipes, thereby reducing energy to be used for the temperature control of the resist solutions. In other words, employment of the preparatory temperature controlling structure enables efficient temperature control of the resist solution even when the length of the temperature controlling pipe is limited due to space or the like.

The circulation unit 31a comprises the temperature controlled water controller 111 and a pre-distribution temperature controller 110 for temperature controlling the supply pipes 122 to 124 through which the resist solutions flow before the temperature controlled water is distributed to the plurality of the temperature controlling pipes 117a to 117c at the manifold 32a. The temperature controlled water controller 111 is provided with a Peltier element 114 as a temperature controlling element, a pump 113 for pumping up the temperature controlled water in the preparatory temperature controller 120, and a pipe 121 through which the temperature controlled water flows from the preparatory temperature controller 120 through the pump 113 and the Peltier element 114 into the pre-distribution temperature controller 110. Further, the pre-distribution temperature controller 110 is provided with a temperature sensor 116 for measuring the temperature of the temperature controlled water. A controller 151 manages the temperature of the temperature controlled water using the temperature sensor 116. The controller 151 controls the operation (the pump-up quantity) of the pump 113 and controls the temperature of the temperature control by the Peltier element 114 or the like in accordance with the temperature of the pre-distribution temperature controller 110 detected by the temperature sensor 116 so as to bring the temperature to the desired temperature. The pre-distribution temperature controller 110 of the circulation unit 31a and the manifold 32a are arranged to be adjacent.

Further, to the Peltier element 114, cooling water is adapted to circulate from a cooling water tank 115. Thus, when the set temperature of the processing solution is decreased, the cooling water is circulated to decrease the temperature of the temperature controlled water, thereby decreasing the set temperature of the processing solution. The cooling water in the cooling water tank 115 can also be used as cooling water for the Peltier element 114. As described above, when the set temperature of the processing solution is decreased, the temperature controlled water at a temperature lower than the set temperature is flowed to thereby control the temperature. An overshoot phenomenon often happens, however, in which, when the temperature of the processing solution reaches the set temperature, the temperature does not stop falling at the set temperature and further falls. To prevent the phenomenon, it is required to increase the temperature of the temperature controlled water just before the temperature of the processing solution reaches the set temperature. On the other hand, when the set temperature of the processing solution is to be increased, the temperature control is conducted by increasing electric current flowing through the Peltier element 114. For these temperature controls, the PID control is employed, in which control is conducted based on a previously set PID values that is a PID value during heating, a PID value during stable time, and a PID value during cooling. In this embodiment, the temperature controlled water flows inside the chemical area of the system, requiring a small quantity of the temperature controlled water as compared with the case in which the circulation unit is disposed outside the system, therefore, the temperature control of the temperature controlled water can easily be conducted. Alternatively, it is also possible to control the discharge power of the pump 113 to thereby control the flow rate of the temperature controlled water so as to change the temperature of the temperature controlled water.

It should be noted that the cooling water circulates from the cooling water tank 115 to the Peltier element 114 in the above-described embodiment, but it is, of course, possible to circulate cooling gas in place of the cooling water.

Figure 8:
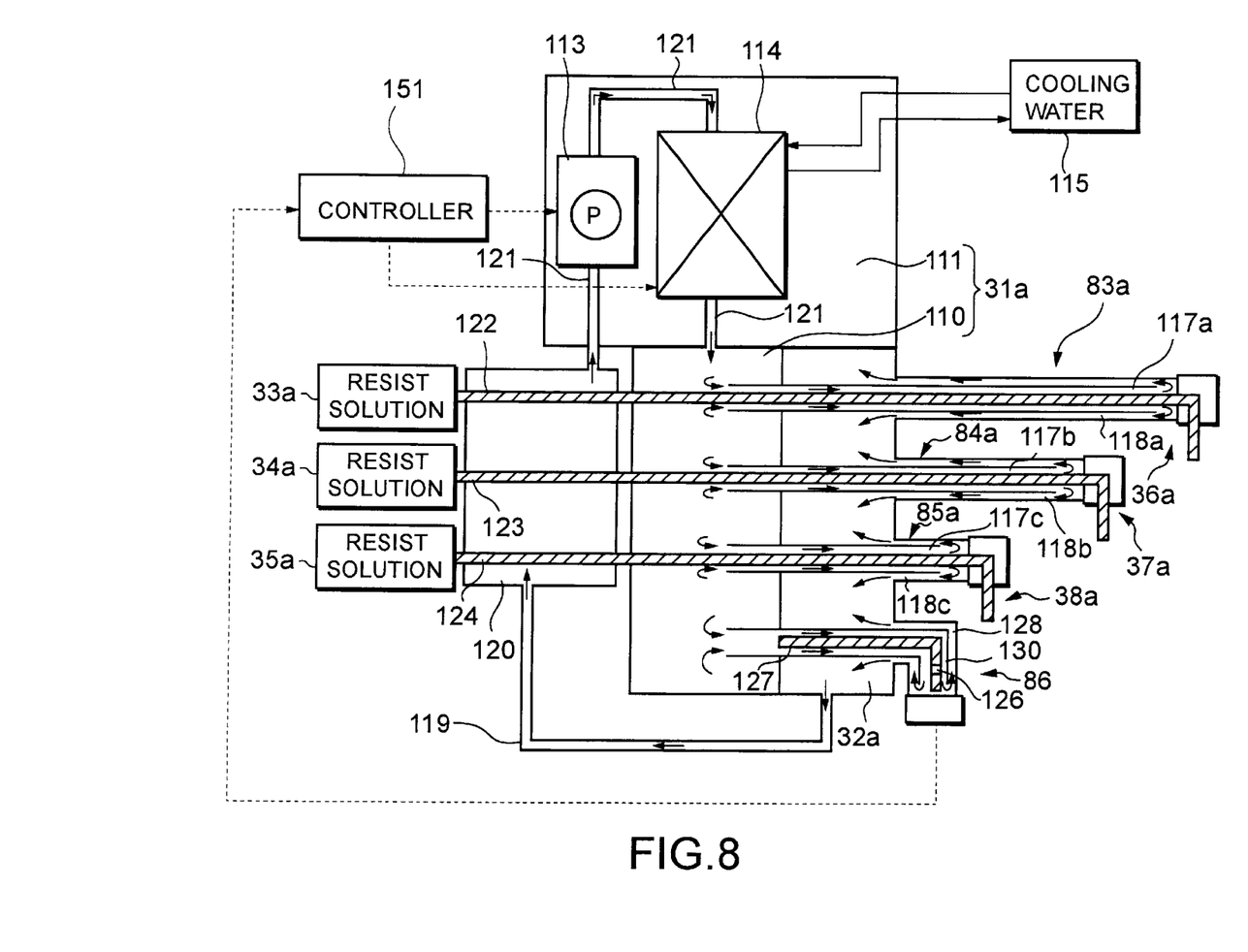
FIG. 8 is a diagram for explaining the structure of a resist solution supply system in another chemical area.

Although the temperature sensor 116 is provided at the pre-distribution temperature controller 110 of the circulation unit 31a in the above-described embodiment, it is also preferable to further provide a dummy tube 86 as a dummy pipe that is a pseudo pipe for controlling the temperature of the processing solution and to provide a temperature sensor 126 at a part of the inside of the dummy tube 86 as shown in FIG. 8. Incidentally, the same numerals are given to the same components as those in FIG. 7, and the explanation on the same components is partially omitted.

As shown in FIG. 8, the dummy tube 86 includes a circulation pipe 127 in which, for example, silicon oil that is a pseudo resist solution flows, and a temperature controlling pipe 130 as a third temperature controller disposed to cover a part of the circulation pipe 127. In the temperature controlling pipe 130, the temperature controlled water distributed at the manifold 32a passes as in the other temperature controlling pipes 117a to 117c. This temperature controlled water is adapted to pass a drain pipe 128, communicating with the temperature controlling pipe 130 in the vicinity of its end and provided to surround this temperature controlling pipe, and flow through the manifold 32a into the supply pipe 119. The dummy tube 86 is partially controlled in temperature by the preparatory temperature controller 120 similarly to the other tubes 83a to 85a, and further controlled in temperature in the pre-distribution temperature controller 110. In the figure, the tubes 83a to 85a have different lengths, but all have the same length in practice, and the lengths of the temperature controlling pipes 117a to 117c are also identical. Moreover, the length of the temperature controlling pipe 130 for the dummy tube 86 is also the same as that of the temperature controlling pipes 117a to 117c. The temperature controlled water flowing inside the temperature controlling pipe 130 has the same temperature control conditions by the temperature controlling pipe and the preparatory temperature controller as those of the tubes 83a to 85a. Further, the temperature sensor 126 is provided inside the temperature controlling pipe 130 of the dummy tube 86. The position where the temperature sensor 126 is provided corresponds to the positions of the nozzles 36a to 38a of the other tubes 83a to 85a. Hence, the temperature of the temperature controlled water or the resist solution measured by the temperature sensor 126 can be recognized substantially the same as those of the resist solutions discharged from the nozzles 36a to 38a of the other tubes 83a to 85a, so that more accurate temperature control of the resist solutions can be conducted as compared with the above-describe embodiment. When the temperature sensor 126 measures a temperature at an undesirable value, this information is sent to the controller not shown, controlling the Peltier element 114 to control the temperature of the temperature controlled water. As the liquid flowing through the dummy tube 86, it is suitable to use liquid exhibiting temperature change close to that of the resist solution which flows through the other tubes, and thus silicon oil is used here.

Figure 9:
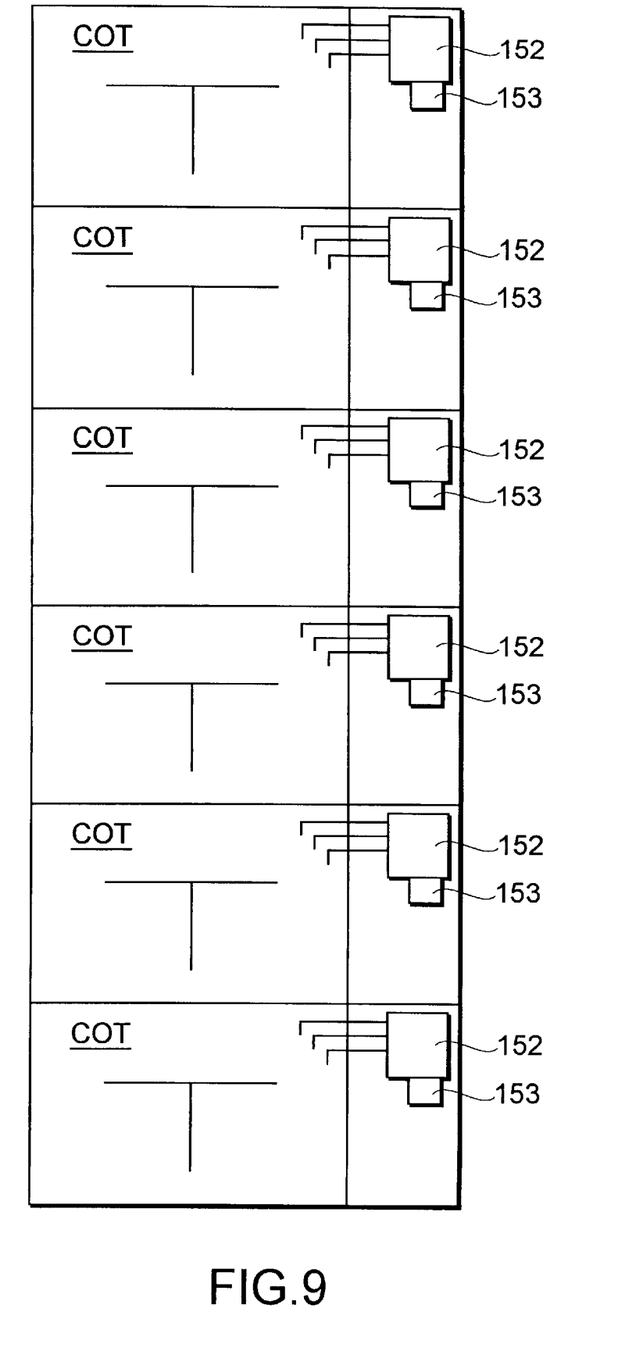
FIG. 9 is a front view showing a part of the construction of a coating and developing processing system for a semiconductor wafer according to another embodiment of the present invention.

FIG. 9 is a view showing the structure of a part of a coating and developing system according to another embodiment of the present invention.

In the system 1 of the first shown embodiment, the spinner-type units are two-tiered as shown in FIG. 2, but in the system according to this embodiment, for example, resist coating units (COT) are six-tiered as shown in FIG. 9. In the system 1 of the first shown embodiment, the manifold 32a (32b) and the circulation unit 31a (31b) are arranged in the chemical area 13 in the processing station 11, that is, at the lower portion of the system 1. Meanwhile, in the system according to this embodiment, manifolds 152 and a circulation units 153 are provided to be adjacent to the resist coating units (COT) respectively as shown in FIG. 9, so that the resist solution is supplied from a pair of units, the manifold 152 and the circulation unit 153, to each adjacent resist coating unit (COT).

According to the system of this embodiment, it is possible to extremely shorten the distance from the manifold 152 and the circulation unit 153 to the resist coating unit (COT) on the supply side, thereby more accurately controlling the temperature of the resist solution that is a processing solution.

In the above-described embodiments, the case in which the present invention is applied to the apparatus for applying the resist solution to the semiconductor wafer is explained, but the present invention is also applicable to an apparatus for applying the resist solution to a substrate other than the semiconductor wafer, for example, an LCD substrate. Further, the supply structure of the resist solution is explained taking an example of the resist coating unit (COT) in the above-described embodiments, but it is also applicable to, for example, the developing unit (DEV). In other words, the present invention can be applied to the case in which some processing solution is applied onto the substrate and when temperature control is conducted to the processing solution.

As has been described, according to the present invention, the temperature control of the processing solution can be conducted with high energy efficiency.

The disclosure of Japanese Patent Application No.2000-200974 filed Jul. 3, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An apparatus for processing a substrate, comprising:
a holder holding a substrate;
a plurality of nozzles which supply a processing solution on to the held substrate;
a plurality of supply pipes connected to each of the plurality of nozzles, supplying the processing solution to the plurality of nozzles and causing the processing solution flow inside;
a dummy pipe having a dummy liquid circulating inside;
a manifold controlling a temperature of the processing solution and the dummy liquid with a temperature controlled water; and
a temperature controlled water supplier which supplies the temperature controlled water to the manifold.

2. The apparatus as set forth in claim 1,
wherein the temperature controlled water circulates between the manifold and the temperature controlled water supplier.

3. The apparatus as set forth in claim 2,
wherein the temperature controlled water supplier has a pump to circulate the temperature controlled water and a temperature controller which controls the circulated temperature controlled water to a predetermined temperature.

4. The apparatus as set forth in claim 3,
wherein the temperature controller has a Peltier element to control the temperature controlled water in the predetermined temperature.

5. The apparatus as set forth in claim 4,
wherein the temperature controller has a cooling water supply mechanism to control the predetermined temperature of the temperature controlled water.

6. The apparatus as set forth in claim 4,
wherein the temperature controller has a cooling gas supply mechanism to control the temperature controlled water to the predetermined temperature.

7. The apparatus as set forth in claim 3,
a sensor which detects a temperature of the dummy pipe; and
a controller controlling at least one of the pump and the temperature controller corresponding to the detected temperature.

8. The apparatus as set forth in claim 3, further comprising:
a supplementary temperature controller which supplementary controls the temperature of the processing solution with the temperature controlled water circulating between the manifold and the temperature controlled water supplier.

9. The apparatus as set forth in claim 1,
wherein the manifold and the temperature controlled water supplier are integrated.

10. An apparatus for processing a substrate, comprising:
a holder holding a substrate;
a supply pipe being supplied with a processing solution from a first end, and supplying the processing solution to the substrate from a second end;
a first temperature controller having a first temperature controlled water circulated inside, which controls a first temperature around the second end of the supply pipe;
a second temperature controller having a second temperature controlled water drained from the first temperature controller circulated inside, which controls a second temperature around the first end of the supply pipe;
a dummy pipe having a dummy liquid circulating inside;
a third temperature controller having a third temperature controlled water inside, which controls a third temperature of a first part of the dummy pipe; and
wherein the third temperature controlled water drained from the third temperature controller is supplied to the second temperature controller, and the second temperature controller controls temperature of a second part of the dummy pipe.

11. The apparatus as set forth in claim 10, further comprising:
a temperature controlling portion controlling the temperature of the first temperature controlled water being supplied to the first temperature controller, wherein the second temperature controlled water drained from the second temperature controller is recycled to the temperature controlling portion.

12. A resist coating and developing processing system, comprising:

a resist solution supply unit having a holder which holds the substrate and a plurality of nozzles supplying a resist solution to the held substrate;

a developing processing unit performing a developing process to the substrate after the exposure;

a heat processing unit performing a heat process on the substrate;

a transfer mechanism transferring the substrate at least between the resist solution supply unit, the developing processing unit and the heat processing unit;

a plurality of supply pipes connected to each of the plurality of nozzles, supplying the resist solution to the plurality of nozzles and causing the resist solution flow inside thereof;

a dummy pipe having a dummy liquid circulating inside;

a manifold controlling a temperature of the resist solution and the dummy liquid with a temperature controlled water; and a temperature controlled water supplier which supplies the temperature controlled water to the manifold.

13. The system as set forth in claim 12, wherein the manifold and the temperature controlled water supplier are integrated.

14. The system as set forth in claim 13, wherein at least said each of the resist solution supply unit is multi tiered, and the integrated manifold and the temperature controlled water supplier is disposed adjacent to said each of the resist solution supply unit.

* * * * *

UNITED STATES PATENT AND TRADEMARK OFFICE
CERTIFICATE OF CORRECTION

PATENT NO. : 6,620,245 B2
DATED : September 16, 2003
INVENTOR(S) : Seiki Ishida et al.

It is certified that error appears in the above-identified patent and that said Letters Patent is hereby corrected as shown below:

<u>Column 9,</u>
Lines 53 to 67, Claim 1 should read:

1. An apparatus for processing a substrate, comprising:
    a holder holding a substrate;
    a plurality of nozzles which supply a processing solution on to the held substrate;
    a plurality of supply pipes connected to each of the plurality of nozzles, supplying the processing solution to the plurality of nozzles and causing the processing solution flow inside thereof;
    a dummy pipe having a dummy liquid circulating inside;
    a manifold controlling a temperature of the processing solution and the dummy liquid with a temperature controlled water; and
    a temperature controlled water supplier which supplies the temperature controlled water to the manifold.

Signed and Sealed this

Twenty-seventh Day of April, 2004

JON W. DUDAS
*Acting Director of the United States Patent and Trademark Office*